(12) United States Patent
Seo et al.

(10) Patent No.: US 6,573,602 B2
(45) Date of Patent: Jun. 3, 2003

(54) SEMICONDUCTOR DEVICE WITH A SELF-ALIGNED CONTACT AND A METHOD OF MANUFACTURING THE SAME

(75) Inventors: Jun Seo, Gyeonggi-do (KR); Tae-Hyuk Ahn, Yongin (KR); Myeong-Cheol Kim, Suwon (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 10/193,091

(22) Filed: Jul. 12, 2002

(65) Prior Publication Data

US 2003/0011076 A1 Jan. 16, 2003

(30) Foreign Application Priority Data

Jul. 12, 2001 (KR) .................................... 2001-0042010

(51) Int. Cl.[7] .............................................. H01L 2/302
(52) U.S. Cl. .................. 257/753; 257/754; 257/758; 257/760; 257/774
(58) Field of Search ............................... 257/753, 754, 257/758, 760, 774

(56) References Cited

U.S. PATENT DOCUMENTS

| 5,414,302 | A | * | 5/1995 | Shin et al. | 257/758 |
| 5,677,557 | A | * | 10/1997 | Wuu et al. | 257/754 |
| 5,793,114 | A | * | 8/1998 | Nguyen et al. | 257/774 |
| 5,847,465 | A | * | 12/1998 | Liou et al. | 257/774 |
| 6,072,241 | A | * | 6/2000 | Kojima | 257/758 |
| 6,091,154 | A | * | 7/2000 | Ohkawa | 257/774 |
| 6,194,784 | B1 | * | 2/2001 | Parat et al. | 257/774 |
| 6,384,441 | B1 | * | 5/2002 | Sugiyama et al. | 257/774 |
| 6,469,389 | B2 | * | 10/2002 | Juengling et al. | 257/774 |

* cited by examiner

*Primary Examiner*—John F. Niebling
*Assistant Examiner*—Lynne A. Gurley
(74) *Attorney, Agent, or Firm*—Lee & Sterba, P.C.

(57) ABSTRACT

A semiconductor device having a self-aligned contact and a method for forming the same, including a semiconductor substrate having a self-aligned contact region and a non-self-aligned contact region; a self-aligned contact exposing a portion of the self-aligned contact region; a first insulating layer formed on the semiconductor substrate that exposes the self-aligned contact; conductive patterns formed on the first insulating layer and spaced apart from each other; spacers formed on sidewalls of each of the conductive patterns; a second insulating layer formed over the first insulating layer that exposes the self-aligned contact; a third insulating layer formed between the second insulating layer and the spacer; a fourth insulating layer formed over the non-self-aligned contact region and on sidewalls of the spacers over the self-aligned contact region; and a fifth insulating layer formed on a portion of the fourth insulating layer over the non-self-aligned contact region.

14 Claims, 6 Drawing Sheets

SEMICONDUCTOR DEVICE WITH A SELF-ALIGNED CONTACT AND A METHOD OF MANUFACTURING THE SAME

BACKGROUND OF THE INVENTION

1. Field of the Invention

The present invention relates to a semiconductor memory device. More particularly, the present invention relates to a semiconductor memory device having a self-aligned contact and a method of manufacturing the same.

2. Description of the Related Art

Increases in the integration of semiconductor memory devices have prompted a reduction in a semiconductor device design rule. In order to meet this trend, contacts are being formed by a self-aligned method.

To form a self-aligned contact, a spacer made of a nitride layer is formed on sidewalls of a conductive pattern such as a gate. Subsequently, an interlayer insulating layer is etched using the nitride layer as an etch stopper. However, if the substrate is exposed during the etching process in this method of forming a spacer and a self-aligned contact, junction damage may result.

FIGS. 1A to 1F illustrate cross-sectional views of a conventional process of manufacturing a self-aligned contact of a conventional semiconductor device.

Referring to FIG. 1A, a semiconductor substrate 10 made of silicon, for example, includes a self-aligned contact region 11 and a non-self-aligned contact region 12. A gate insulating layer 13 made of an oxide layer is formed on the semiconductor substrate 10. A plurality of gates 14 are formed on the gate insulating layer 13. A mask layer 15 is formed on each of the plurality of gates 14. Each gate 14 has a single- or a multi-layered structure having a polysilicon layer.

Referring to FIG. 1B, the polysilicon layer of the gates 14 undergoes an oxidation process to form an oxide layer 16. Thereafter, a first nitride layer 17 is formed over the entire surface of the semiconductor substrate 10.

Referring to FIG. 1C, the first nitride layer 17 is anisotropically etched to form a spacer 18. Here, during the anisotropic etching process, the oxide layer 16 is also etched, whereupon part or all of the gate insulating layer 13 is etched as well.

Referring to FIG. 1D, a second nitride layer 19 and an interlayer insulating layer 20 are sequentially formed over the entire surface of the semiconductor substrate 10.

Referring to FIG. 1E, using the second nitride layer 19 as an etch stopper, a portion of the interlayer insulating layer 20 over the self-aligned region 11 is etched. Subsequently, a portion of the second nitride layer 19 and the gate insulating layer 13 over the self-aligned region 11 are etched to form a self-aligned contact 21 as shown in FIG. 1F.

In the method of forming the conventional self-aligned contact described above, it is possible that during the etching process of the first nitride layer 17 to form the spacer 18, part or all of the gate insulating layer 13 is also etched, thereby exposing the semiconductor substrate. Therefore, the gate insulating layer 13 cannot satisfactorily serve as a buffer layer for absorbing etching damage when the interlayer insulating layer 20 is etched to form the self-aligned contact 21. As a result, junction damage may occur.

An ion doping process and a cleaning process are additionally performed subsequent to etching the first nitride layer 17 to form the spacer 18. During the ion doping process and the cleaning process, the gate insulating layer 13 becomes emaciated, thereby making the junction damage more serious, leading to a significant junction leakage characteristic. Accordingly, a static refresh characteristic of a semiconductor memory device deteriorates.

SUMMARY OF THE INVENTION

In an effort to overcome the problems described above, it is a feature of an embodiment of the present invention to provide a semiconductor device having a self-aligned contact and a method of manufacturing the same, which is capable of preventing junction damage.

It is another feature of an embodiment of the present invention to provide a semiconductor device having a self-aligned contact and a method of manufacturing the same, which is capable of improving a junction leakage characteristic and thus improve a static refresh characteristic in the semiconductor device.

In order to provide these and other features, a preferred embodiment of the present invention provides a semiconductor device having a self-aligned contact, including: a semiconductor substrate having a self-aligned contact region and a non-self-aligned contact region; a self-aligned contact exposing a portion of the self-aligned contact region of the semiconductor substrate; a first insulating layer formed on the semiconductor substrate that exposes a portion of the semiconductor substrate corresponding to the self-aligned contact; a plurality of conductive patterns formed on the first insulating layer and spaced apart from each other; spacers formed on sidewalls of each of the plurality of conductive patterns; a second insulating layer formed over the first insulating layer that exposes the self-aligned contact in the self-aligned contact region, and formed over the entire surface of the first insulating layer in the non-self-aligned contact region; a third insulating layer formed between the second insulating layer and the spacer; a fourth insulating layer formed over the entire surface of the non-self-aligned contact region and formed on sidewalls of the spacers over the self-aligned contact region; and a fifth insulating layer formed on a portion of the fourth insulating layer over the non-self-aligned contact region.

The conductive pattern may have either a single- or multi-layered structure preferably made of a polysilicon, and the first insulating layer is preferably a gate oxide layer. The second insulating layer is preferably a high temperature oxide layer formed by an oxidation process for the polysilicon layer. The second insulating layer may serve as a buffer layer to prevent etching damage. The second insulating layer remaining on a portion of the first insulating layer over the non-self-aligned contact region preferably has a thickness of at least about 20 Å. The third insulating layer is preferably formed at a temperature lower than the temperature at which the second insulating layer is formed. Part of the third insulating layer that lies beneath an etched portion of the fourth insulating layer preferably remains on a portion of the second insulating layer over the non-self-aligned contact region. A total thickness of the second and third insulating layers over the non-self-aligned contact region is preferably at least about 20 Å. The fourth insulating layer should have an etching selectivity with respect to the second, the third and the fifth insulating layers. The fourth insulating layer is preferably a nitride layer for an etch stopper. The fifth insulating layer is preferably an oxide layer for an interlayer insulating layer.

An embodiment of the present invention further provides a method of manufacturing a semiconductor device having a self-aligned contact, including: providing a semiconductor substrate having a self-aligned contact region and a non-self-aligned contact region; forming a first insulating layer on the semiconductor substrate; forming a plurality of conductive patterns on the first insulating layer; forming sequentially second, third and fourth insulating layers over the entire surface of the semiconductor substrate; etching the fourth insulating layer to form spacers on sidewalls of the conductive patterns; forming sequentially fifth and sixth insulating layers over the entire surface of the semiconductor substrate; and etching the sixth insulating layer using a portion of the fifth insulating layer over the self-aligned contact region as an etch stopper, and etching the fifth insulating layer to form a self-aligned contact.

The conductive pattern may have a single- or multi-layered structure made of a polysilicon, and the first insulating layer is preferably a gate oxide layer. The second insulating layer is preferably a high temperature oxide layer formed by an oxidation process for the polysilicon layer. The third insulating layer is preferably formed at a temperature lower than the temeprature at which the second insulating layer is formed. The fourth insulating layer is preferably an insulating layer for the spacer, preferably made of a nitride layer having an etching selectivity with respect to the second and third insulating layers. The method may further include, after etching the fourth insulating layer to form spacers on sidewalls of the conductive patterns, an ion doping process and a cleaning process. A thickness of the remaining second insulating layer or a total thickness of the remaining second insulating layer and the remaining third insulating layer after the ion doping process and the cleaning process is preferably at least about 20 Å. The remaining second insulating layer and/or the remaining third insulating layer may serve as a buffer layer to prevent etching damage. The fifth insulating layer is preferably a nitride layer used as an etch stopper, and the sixth insulating layer is preferably an oxide layer used as an interlayer insulating layer.

BRIEF DESCRIPTION OF THE DRAWINGS

For a more complete understanding of the present invention, including the above and other features and advantages thereof, reference is now made to the following detailed description taken in conjunction with the accompanying drawings, in which like reference numerals denote like elements throughout, and in which.

DETAILED DESCRIPTION OF THE INVENTION

Korean Patent Application No. 2001-42010, filed on Jul. 12, 2001, and entitled: "Semiconductor Device with Self-Aligned Contact and Method of Manufacturing the Same," is incorporated by reference herein in its entirety.

Reference will now be made in detail to preferred embodiments of the present invention, an example of which is illustrated in the accompanying drawings.

FIGS. 2A to 2F illustrate cross-sectional views of a process of manufacturing a self-aligned contact of a semiconductor memory device according to an embodiment of the present invention.

Figure 1A:
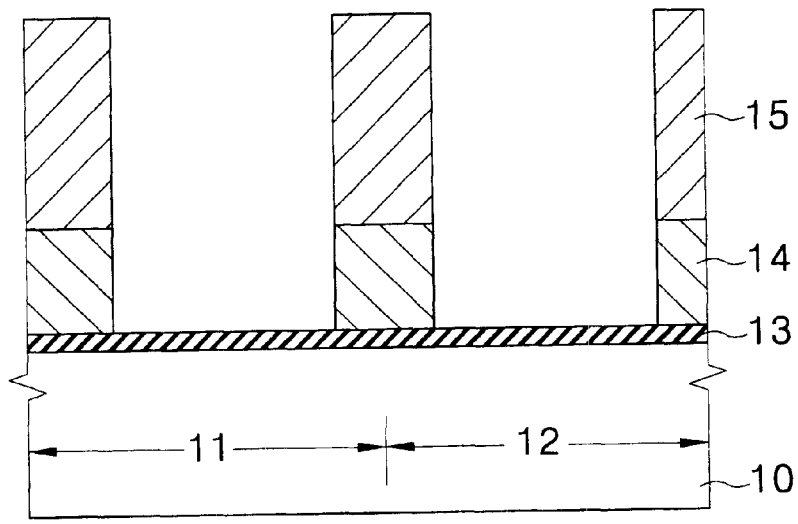
FIGS. 1A to 1F illustrate cross-sectional views of a conventional process of manufacturing a self-aligned contact of a conventional semiconductor device.
Figure 1B:
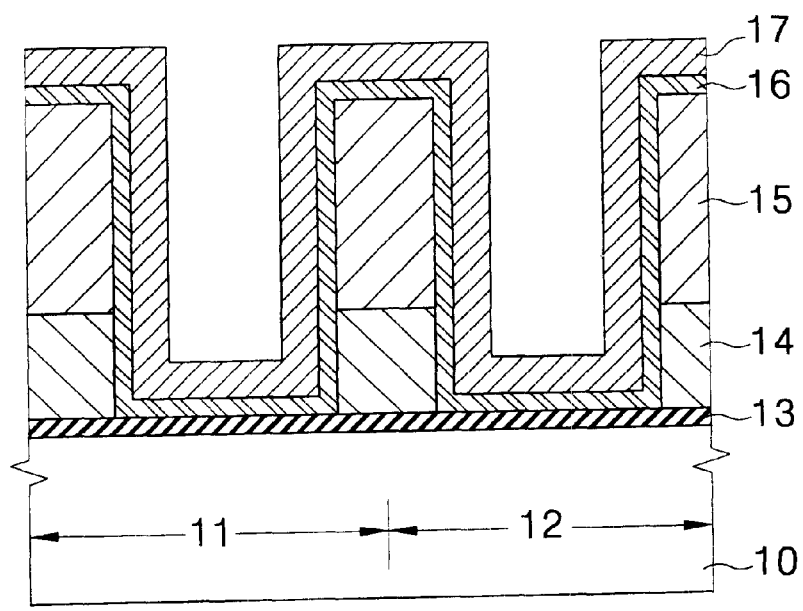
Figure 1C:
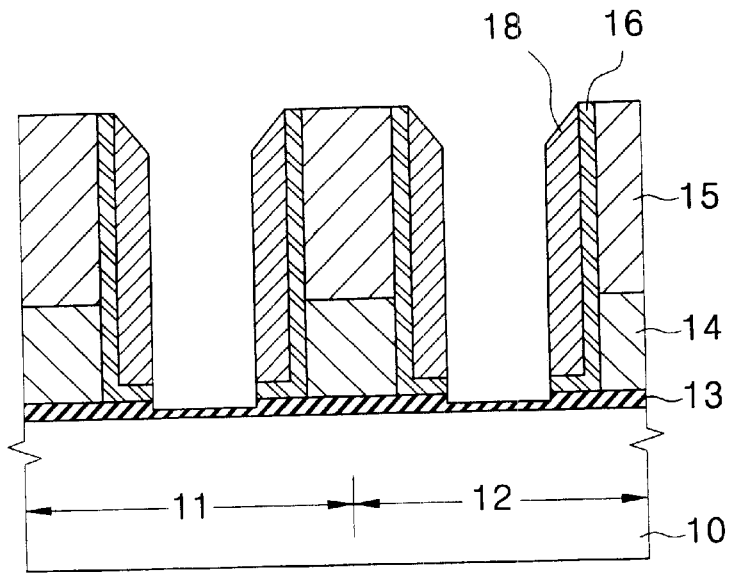
Figure 1D:
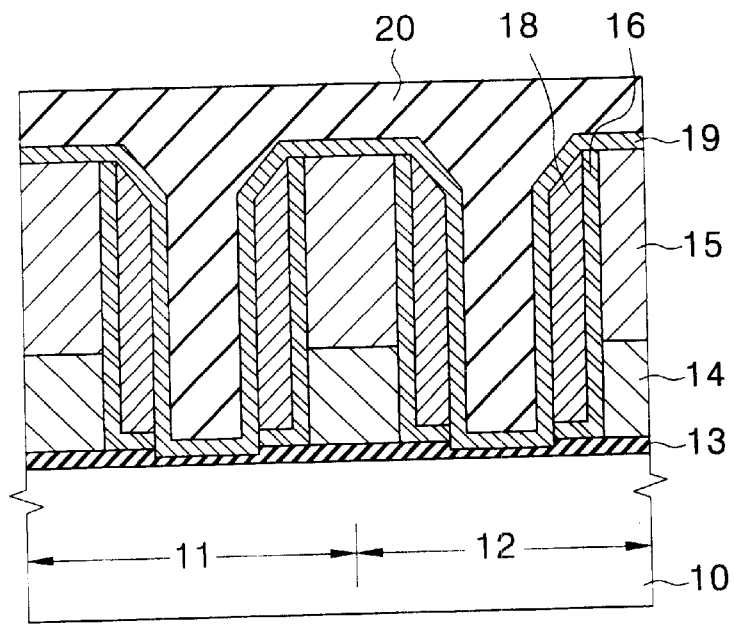
Figure 1E:
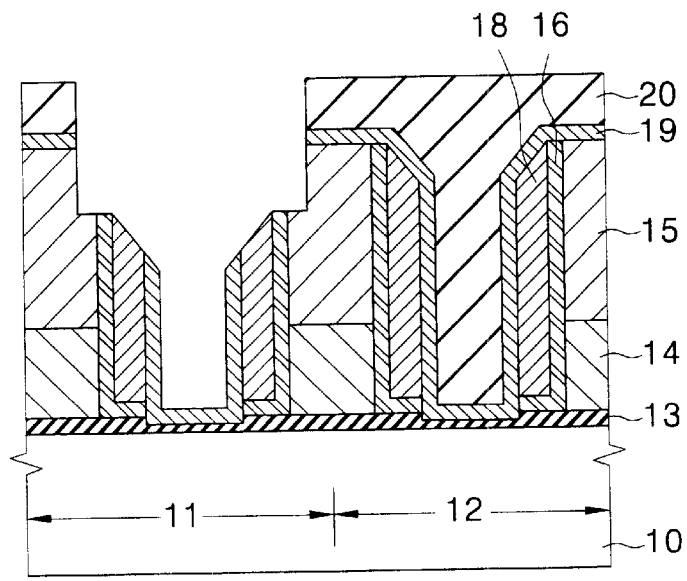
Figure 1F:
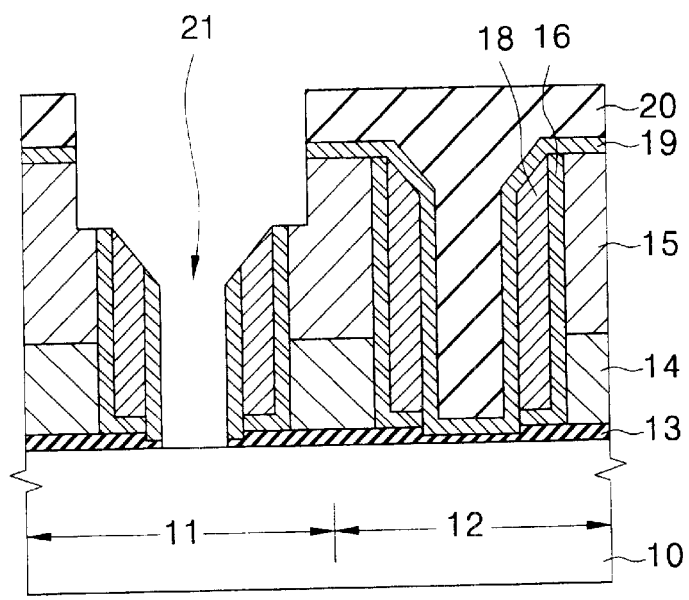
Figure 2A:
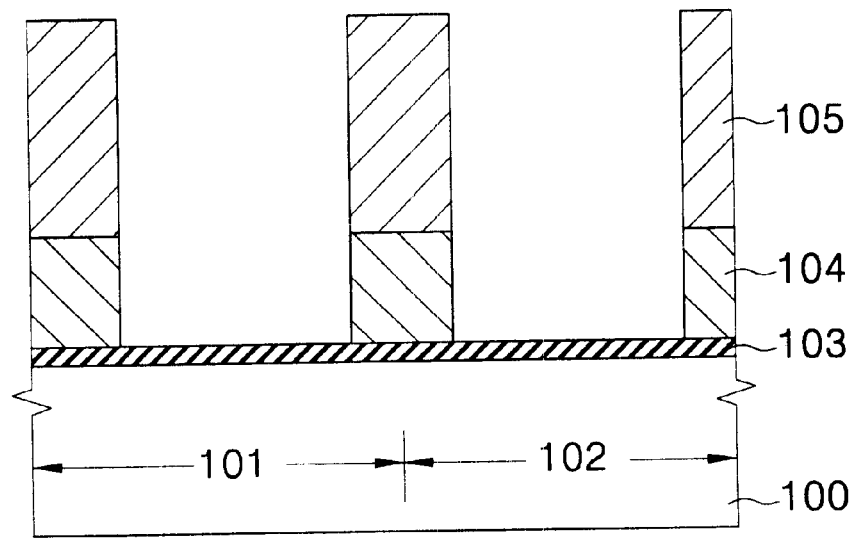
FIGS. 2A to 2F illustrate cross-sectional views of a process of manufacturing a self-aligned contact of a semiconductor memory device according to an embodiment of the present invention.

Referring to FIG. 2A, a semiconductor substrate 100 made of silicon, for example, includes a self-aligned contact region 101 and a non-self-aligned contact region 102. A first insulating layer 103 is formed on the semiconductor substrate 100. The first insulating layer 103 serves as a gate insulating layer and is made of an oxide layer formed to a thickness of about 50 Å.

A plurality of gates 104 are formed on the first insulating layer 103. A mask layer 105 is formed on each of the plurality of gates 104. The gates 104 may have a single- or a multi-layered structure having a polysilicon layer.

Figure 2B:
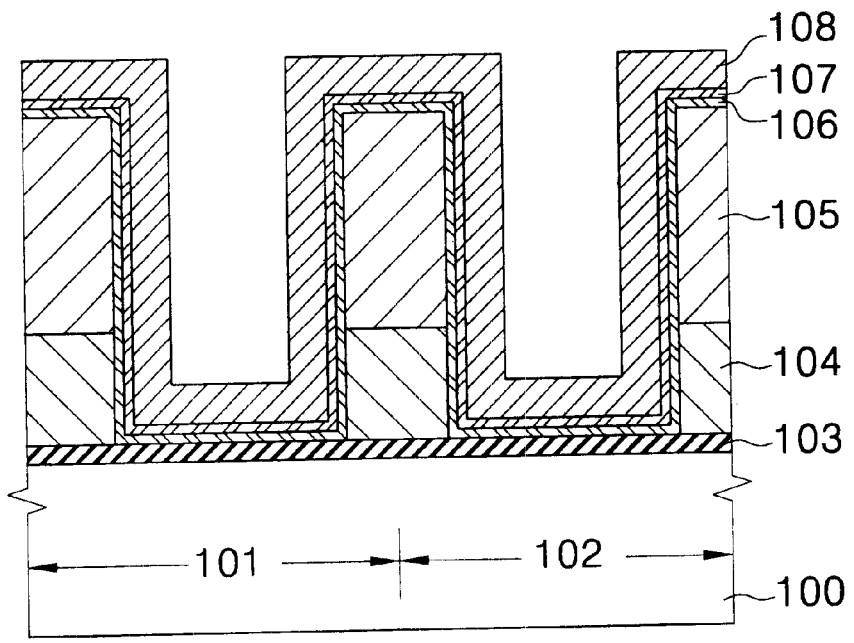

Referring to FIG. 2B, second, third and fourth insulating layers 106, 107 and 108 are sequentially formed over the entire surface of the semiconductor substrate 100. The second and third insulating layers 106 and 107 serve as a buffer layer to prevent etching damage from occurring during a subsequent etching process to form a spacer. The second and third insulating layers 106 and 107 have an etching selectivity with respect to the fourth insulating layer 108.

In this embodiment, the second insulating layer 106 is a high temperature oxide layer formed by an oxidation process at a temperature of about 800° C. The third insulating layer 107 is a middle temperature oxide layer deposited at a temperature lower than that at which the second insulating layer 106 is formed. The second insulating layer 106 and the third insulating layer 107 each have a thickness of about 50 Å. Meanwhile, the fourth insulating layer 108 is made of a nitride layer.

Figure 2C:
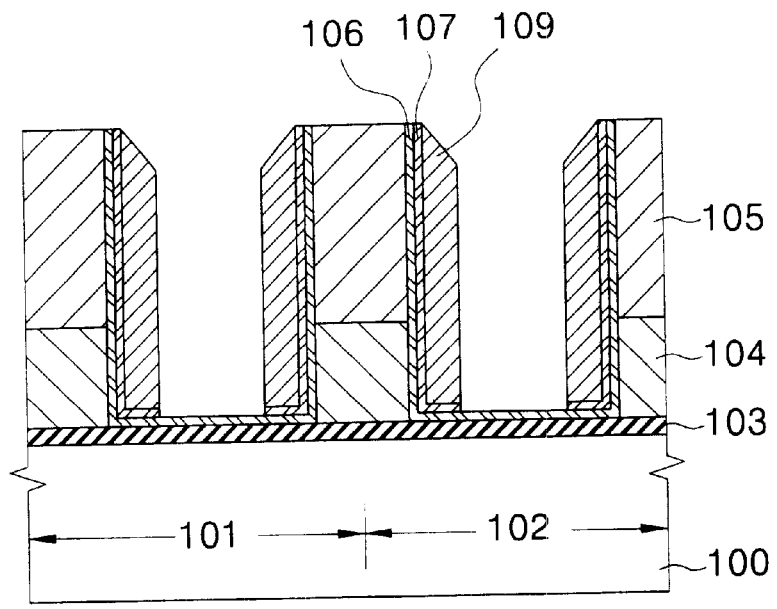

Referring to FIG. 2C, the fourth insulating layer 108 is anisotropically etched to form a spacer 109. During the etching process of the fourth insulating layer 108, part or all of the third insulating layer 107 that lies beneath the etched portions of the fourth insulating layer 108 may be etched. At this point, even if the entirety of the third insulating layer 107 that lies beneath the etched portions of the fourth insulating layer 108 is etched while etching fourth insulating layer 108, etching damage may still be prevented due to the presence of the second insulating layer 106.

Although not shown, a subsequent ion doping process and cleaning process may be performed, and part of the third insulating layer 107 or the second insulating layer 106 may be etched. For example, all of the third insulating layer 107 that lies beneath the etched portions of the fourth insulating layer 108 may be removed and only the second insulating layer 106 may remain after the ion doping process and the cleaning process, as illustrated in FIG. 2C. However, part of the third insulating layer 107 may remain on the second insulating layer 106.

Here, it is preferred that a total thickness of the remaining third insulating layer 107 and the second insulating layer 106 be more than about 20 Å. By providing such a remaining thickness, any remaining third insulating layer 107 and second insulating layer 106 will make a superior buffer layer to prevent etching damage in a subsequent etching process in which an insulating layer is etched to form a self-aligned contact.

Figure 2D:
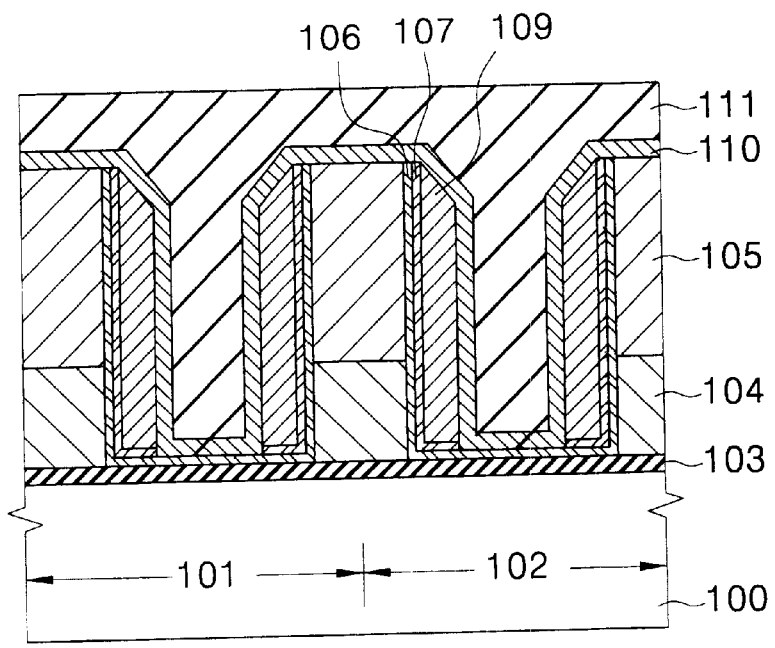

Referring to FIG. 2D, fifth and sixth insulating layers 110 and 111 are sequentially formed over the entire surface of the semiconductor substrate 100. The fifth insulating layer 110 serves as an etch stopper during an etching process of the sixth insulating layer 111. The fifth insulating layer 110 is made of a nitride layer having an etching selectivity with respect to the second and third insulating layers 106 and 107 and the sixth insulating layer 111. The sixth insulating layer 111 serves as an interlayer insulating layer and is preferably made of an oxide layer.

Figure 2E:
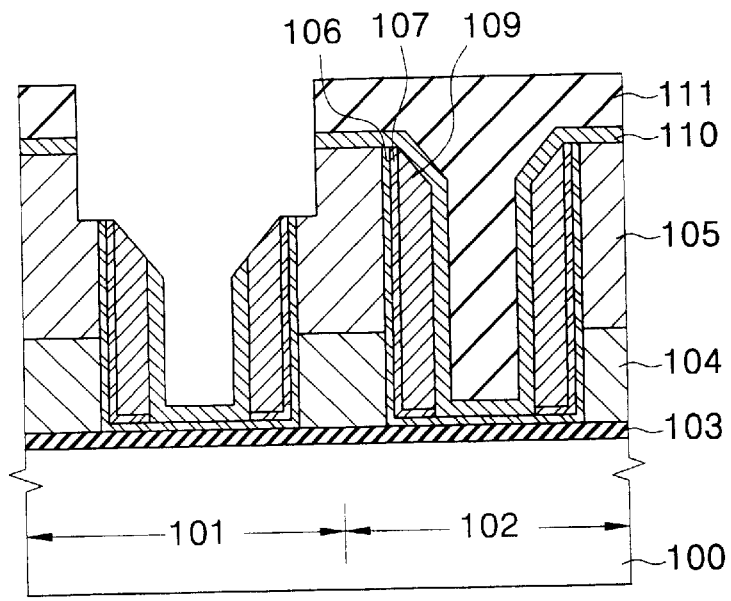

Referring to FIG. 2E, using the fifth insulating layer 110 as an etch stopper, a portion of the sixth insulating layer 111 over the self-aligned contact region 101 is etched.

Figure 2F:
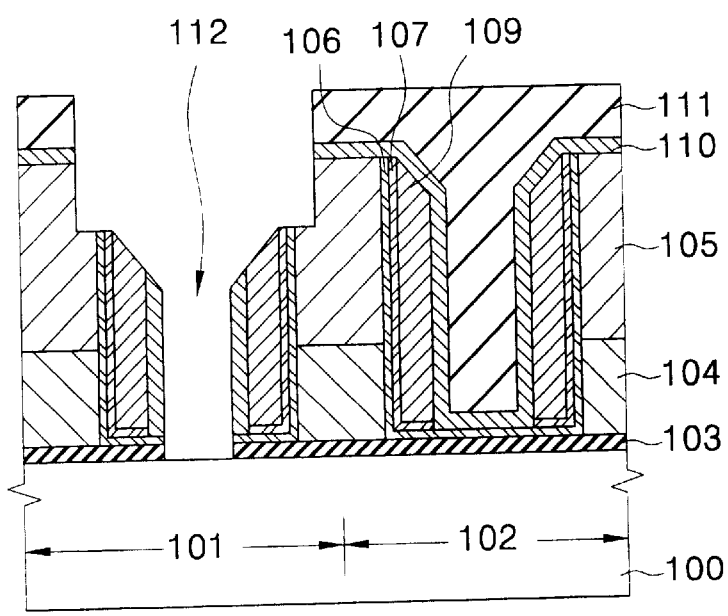

Referring to FIG. 2F, the exposed portions of the fifth insulating layer 110 and portions of the first and second insulating layers 103 and 106 that lie under the exposed portions of the fifth insulating layer 110 are etched to form a self-aligned contact 112.

In the process of forming the self-aligned contact according to the present invention, the third insulating layer 107 is formed at a temperature lower than that at which the second insulating layer 106 is formed. In forming the third insulating layer 107 in this way, the second and third insulating layers 106 and 107 are able to satisfactorily act as buffer layers to prevent etching damage which may occur during a process to form the spacer and the self-aligned contact, respectively. At this time, since the third insulating layer 107 is deposited at a temperature lower than that at which the second insulating layer 106 is formed, it is possible to achieve thermal stability. Therefore, as may be seen in FIG. 2F, the second insulating layer 106 exists on the first insulating layer 103 over the non-self-aligned contact region 102 after formation of the self-aligned contact. Even though not shown in FIG. 2F, part of the third insulating layer 107 that lies beneath the etched portion of the fourth insulating layer 108 may remain on a portion of the second insulating layer 106 over the non-self-aligned contact region 102.

As described above, according to the method of forming a self-aligned contact of the present invention, a high temperature oxide layer is formed by performing an oxidation process for a polysilicon layer, and then a middle temperature oxide layer is formed. Accordingly, etching damage which may occur during a process of forming a spacer and a process of forming a self-aligned contact may be prevented by the high temperature oxide layer and the middle temperature oxide layer, leading to an improved junction leakage characteristic and an improved static refresh characteristic in a semiconductor memory device.

Preferred embodiments of the present invention have been disclosed herein and, although specific terms are employed, they are used and are to be interpreted in a generic and descriptive sense only and not for the purpose of limitation. Accordingly, it will be understood by those of ordinary skill in the art that various changes in form and details may be made without departing from the spirit and scope of the invention as set forth in the following claims.

What is claimed is:

1. A semiconductor device having a self-aligned contact, comprising:
   a semiconductor substrate having a self-aligned contact region and a non-self-aligned contact region;
   a self-aligned contact exposing a portion of the self-aligned contact region of the semiconductor substrate;
   a first insulating layer formed on the semiconductor substrate that exposes a portion of the semiconductor substrate corresponding to the self-aligned contact;
   a plurality of conductive patterns formed on the first insulating layer and spaced apart from each other;
   spacers formed on sidewalls of each of the plurality of conductive patterns;
   a second insulating layer formed over the first insulating layer that exposes the self-aligned contact in the self-aligned contact region, and formed over the entire surface of the first insulating layer in the non-self-aligned contact region;
   a third insulating layer formed between the second insulating layer and the spacer;
   a fourth insulating layer formed over the entire surface of the non-self-aligned contact region and formed on sidewalls of the spacers over the self-aligned contact region; and
   a fifth insulating layer formed on a portion of the fourth insulating layer over the non-self-aligned contact region.

2. The device as claimed in claim 1, wherein the conductive pattern has a single- or multi-layered structure made of a polysilicon, and the first insulating layer is a gate oxide layer.

3. The device as claimed in claim 2, wherein the second insulating layer is a high temperature oxide layer formed by an oxidation process for the polysilicon layer.

4. The device as claimed in claim 1, wherein the second insulating layer serves as a buffer layer to prevent etching damage.

5. The device as claimed in claim 4, wherein the second insulating layer remaining on a portion of the first insulating layer over the non-self-aligned contact region has a thickness of at least about 20 Å.

6. The device as claimed in claim 3, wherein the third insulating layer is formed at a temperature lower than the temperature at which the second insulating layer is formed.

7. The device as claimed in claim 6, wherein part of the third insulating layer that lies beneath an etched portion of the fourth insulating layer remains on a portion of the second insulating layer over the non-self-aligned contact region.

8. The device as claimed in claim 7, wherein a total thickness of the second and third insulating layers over the non-self-aligned contact region is at least about 20 Å.

9. The device as claimed in claim 1, wherein the fourth insulating layer has an etching selectivity with respect to the second, the third and the fifth insulating layers.

10. The device as claimed in claim 9, wherein the fourth insulating layer is a nitride layer for an etch stopper, and the fifth insulating layer is an oxide layer for an interlayer insulating layer.

11. The device as claimed in claim 1, wherein the first insulating layer is formed to a thickness of about 50 Å.

12. The device as claimed in claim 1, wherein the second and third insulating layers have an etching selectivity with respect to the fourth insulating layer.

13. The device as claimed in claim 1, wherein a sixth insulating layer is formed over the entire surface of the semiconductor substrate.

14. The device as claimed in claim 13, wherein the sixth insulating serves as an interlayer insulating layer and is made of an oxide layer.

* * * * *